Sept. 19, 1961

S. J. SCURO 3,000,092

METHOD OF BONDING CONTACT MEMBERS TO THERMOELECTRIC MATERIAL BODIES

Filed Dec. 10, 1959

WITNESSES:

Bernard R. Gieguey

Raymond F. Majesko

INVENTOR

Samuel J. Scuro

BY

Frederick Shapoe

ATTORNEY

United States Patent Office 3,000,092

Patented Sept. 19, 1961

3,000,092

METHOD OF BONDING CONTACT MEMBERS TO THERMOELECTRIC MATERIAL BODIES

Samuel J. Scuro, Verona, Pa., assignor to Westinghouse Electric Corporation, East Pittsburgh, Pa., a corporation of Pennsylvania Filed Dec. 10, 1959, Ser. No. 858,758
3 Claims. (Cl. 29—472.9)

The present invention relates to an improved process for the preparation of, and affixing to, contacts for thermoelectric elements.

In the construction of thermoelectric devices serious problems arise in the bonding of the metal contact to the ends of the thermoelectric element proper. In a known process of joining the metal contact members to the element using a eutectic solder of the composition of the element to provide a joint between the contact and the element, the lattice structure of the element usually becomes re-arranged at the extremities by the introduction of acceptor and donor atoms into the thermoelectric element thereby lowering the thermoelectric efficiency of the element. Therefore, this type of bond is highly undesirable.

An object of the present invention is to provide a process for joining to a thermoelectric element a metallic electrical contact having a low electrical resistance joint therebetween, by direct fusion of a body of thermoelectric material consisting of indium arsenide, indium arsenide phosphide or indium antimonide with a nickel-clad molybdenum contact member at critical temperatures and pressures in an inert atmosphere for a brief period of time.

Another object of the invention is to provide a procedure for forming a thermoelectric device comprising a thermoelectric element joined to a contact member and characterized by a low electrical resistance and capable of being employed at temperatures of up to 780° C., by joining by direct fusion a body of thermoelectric material consisting of indium arsenide or indium arsenide phosphide with a nickel-clad molybdenum contact member at a critical temperature and pressure in an inert atmosphere for a brief period of time.

Still another object of the invention is to provide a process for forming a thermoelectric device comprising a thermoelectric element electrically joined to a contact member and characterized by a low electrical resistance and capable of being employed at temperatures of up to 520° C., by joining by direct fusion a body of thermoelectric material consisting of indium antimonide with a nickel-clad molybdenum contact member at a critical temperature and pressure in an inert atmosphere for a brief period of time.

Other objects of the invention will, in part, be obvious and will, in part, appear hereinafter.

Figure 2:
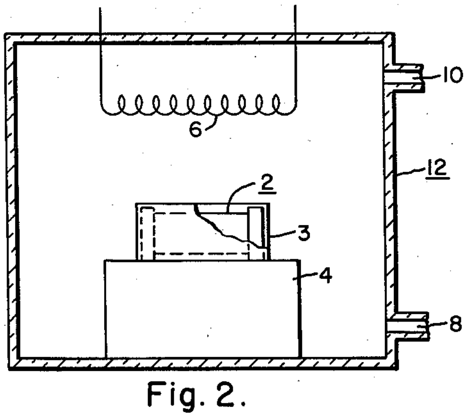
Figure 1:
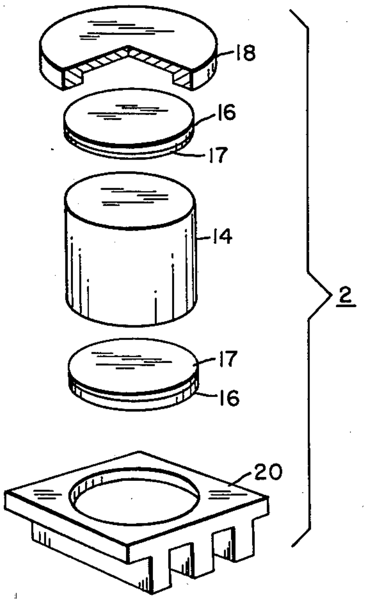

For a better understanding of the nature and objects of this invention, reference should be had to the following detailed description and drawings, in which:

FIGURE 1 is an enlarged, exploded view in perspective of a thermoelectric device assembly prior to being joined in accordance with the teachings of the invention; and FIG. 2 is a schematic view partly in cross-section illustrating members being processed in accordance with the invention.

In accordance with the present invention and attainment of the foregoing objects, there is provided a process for forming a thermoelectric device comprising a thermoelectric element with a metallic electrical contact at one end thereof, the process comprising joining by direct fusion at critical temperatures and under pressure, a body of thermoelectric material with a nickel-clad molybdenum contact member disposed at one end of the body.

The body of thermoelectric material may be composed of indium arsenide, indium arsenide phosphide or indium antimonide. The assembled device is consolidated by heating the members to a temperature of from 765° C. to 780° C. for indium arsenide and indium arsenide phosphide and from 515° C. to 520° C. for indium antimonide while under pressure and in an inert atmosphere, for a brief period of time.

Referring to FIG. 1, there is shown a thermoelectric device 2, in exploded, unassembled form. A shaped body or element 14 of thermoelectric material is prepared by any suitable means, such as, by powder metallurgy techniques, or casting. Contact members 16 each comprise a disc of molybdenum, since the coefficient of thermal expansion of the molybdenum closely matches that of the thermoelectric materials employed for body 14, and a nickel sheet 17 of at least five mils thickness bonded to at least one surface of the molybdenum disc. The maximum thickness of the nickel sheet is dependent upon the thickness of the molybdenum disc. It is desirable that the ratio of thicknesses of the molybdenum to the nickel sheet 17 be maintained at about 4:1.

The nickel-clad molybdenum contact members 16 of the thermoelectric device 2 may be joined to a terminal 18 and a finned radiator 20 by soldering or any other method known to those skilled in the art, preferably, though not necessarily, before the contact members 16 are bonded to body 14.

Each surface of the thermoelectric body 14 and the nickel surfaces of sheets 17 of the contact members are polished so that the joining surfaces of the body of thermoelectric material conform closely to the surfaces of the nickel-clad molybdenum members to which they are to be united. Clean, intimate contact is required at the bonding surfaces.

The assembled device 2 is then placed in a cavity in a suitable fixture composed of stainless steel or any other non-reactive metal or material and is disposed therein. The thermoelectric device is retained in the fixture by a spring disposed at the end thereof in such a manner that a slight amount of pressure is exerted at each end of the terminals 18 and 20. The pressure is of such a magnitude as to force the contact members into intimate relationship with the thermoelectric body.

Referring to FIG. 2, the thermoelectric device assembly 2 is disposed in a hollow fixture 3 and placed on a support 4 within a suitable furnace 12, for example, a quartz or high silica glass tube. The furnace may be heated by an electric coil 6 so that the temperature of the furnace is held between 765° C. to 780° C. in the case of the indium arsenide and the indium arsenide phosphide and between 515° C. to 520° C. in the case of the indium antimonide.

Since the presence of oxidizing and reactive impurities is deleterious to the bond strength, it is necessary that the fusion reaction takes place in a highly purified inert atmosphere, such as argon or helium, or mixtures thereof. The gas may be circulated through the furnace by means of an inlet valve 8 and an outlet valve 10. Argon or helium of a purity of 99.999% has been quite effective.

The body of thermoelectric material and the nickel of the contact member fuse at their contacting faces at a temperature within the ranges indicated depending upon the material and the period of time. The bonding of the thermoelectric element to the nickel surface is of a chemical nature. At the bonding temperature, nickel atoms diffuse into the adjacent surfaces of the thermoelectric element to form a thin layer of a four component alloy in the case of indium arsenide phosphide and a three component alloy in the cases of indium arsenide and indium antimonide, the respective alloy being molten under the conditions obtained in the furnace. This alloy zone constitutes the actual bonding contact between the body and the nickel-clad molybdenum.

The indium arsenide and indium arsenide phosphide thermoelectric elements may be employed in applications that require operating temperatures of up to 780° C. and the indium antimonide thermoelectric element may be employed in applications requiring an operational temperature of up to 520° C., there being no decrease in thermoelectric efficiency when operating at these high temperatures due to the joint.

The contact between the thermoelectric body and the contact member is one of low electrical resistance, approximately $7\times10^{-5}$ ohms, for a thermoelectric body having a resistance of approximately $5\times10^{-4}$ ohms.

The following examples illustrates the teaching of the invention.

*Example I*

An indium arsenide phosphide body with a cross-sectional area of 0.25 $cm.^2$ held in a stainless steel fixture weighing 5 grams was placed in a high silica glass tube furnace having an argon atmosphere, the argon being of high purity and having a dew point of −70° C. The temperature of the furnace was 775° C. and the assembly was held at that temperature for 2 minutes. The temperature was then reduced to room temperature while the thermoelectric device was retained therein.

Similarly, an indium arsenide body of the same dimensions as the body of Example I, was treated under the same conditions as in Example I.

The resulting bonds of Example I were examined, and found to be excellent. In each case the actual bonding layer comprised a thin layer of a four component alloy, for the indium arsenide phosphide body, comprising nickel indium arsenide phosphide and a thin layer of three component alloy, for the indium arsenide body, comprising nickel indium arsenide. The thermoelectric elements were thermally cycled to 800° C. with highly satisfactory results in each case.

*Example II*

An indium antimonide body with a cross-sectional area of 0.25 $cm.^2$ held in a stainless steel fixture weighing 5 grams was placed in a high silica glass tube furnace having an argon atmosphere, the argon being of high purity and having a dew point of −70° C. The temperature of the furnace was 520° C. and the assembly was held at that temperature for 2 minutes. The temperature was then reduced to room temperature while the thermoelectric device was retained therein.

The resulting bond was examined and found to be excellent. It comprised a thin layer of a three component alloy comprising nickel indium antimonide. The thermoelectric element was thermally cycled to 550° C. with highly satisfactory results.

It is to be understood that the above description should be interpreted as being illustrative and not limiting.

I claim as my invention:

1. In a process for forming a thermoelectric device comprising a body of thermoelectric material selected from the group consisting of indium arsenide, indium arsenide phosphide and indium antimonide, with a low resistance metallic electrical contact member at one end thereof, the steps comprising assembling the body with one surface in contact with a nickel surface of a nickel-clad molybdenum contact member, the surface of the body and the nickel surface closely conforming to each other, heating the assembly comprising the contact member and the body of thermoelectric material to a temperature of from 765° C. to 780° C. for the indium arsenide and indium arsenide phosphide and from 515° C. to 520° C. for indium antimonide, while under pressure and in an inert atmosphere for a brief period of time, whereby a direct fusion and alloying takes place between the nickel surface and the thermoelectric material in contact therewith.

2. In a process for forming a thermoelectric device comprising a body of thermoelectric material selected from the group consisting of indium arsenide, indium arsenide phosphide and indium antimonide, with a low resistance metallic electrical contact member at one end thereof, the steps comprising polishing an end surface of the body of thermoelectric material and the nickel surface of a nickel-clad molybdenum member so that they conform closely to each other at the area at which they are to be united, assembling the body with the nickel-clad molybdenum contact member disposed at one end of said body with the polished surfaces being in the conforming contact, heating the assembly comprising the contact member and the body of thermelectric material to a temperature of from 765° C. to 780° C. for the indium arsenide and indium arsenide phosphide and from 515° C. to 520° C. for indium antimonide while under pressure and in an inert atmosphere for a brief period of time, whereby direct fusion and alloying takes place between the nickel surface and the thermoelectric material in contact therewith.

3. In a process for forming a thermoelectric device comprising a body of thermoelectric material selected from the group consisting of indium arsenide, indium arsenide phosphide and indium antimonide, with a low resistance metallic electrical contact member at one end thereof, the steps comprising polishing an end surface of the body of thermoelectric material and the nickel surface of a nickel-clad molybdenum member so that they conform closely to each other at the area at which they are to be united, assembling the body with the nickel-clad molybdenum contact member disposed at one end of said body, the member having a layer of nickel of at least 5 mils in thickness, the ratio of thickness of the molybdenum to the nickel being maintained at about 4:1, heating the assembly comprising the contact member and the body of thermoelectric material to a temperature of from 765° C. to 780° C. for the indium arsenide and indium arsenide phosphide and from 515° C. to 520° C. for indium antimonide while under pressure and in an inert atmosphere for a brief period of time.

References Cited in the file of this patent

UNITED STATES PATENTS

| | | |
|---|---|---|
| 511,245 | Mestern | Dec. 19, 1893 |
| 2,137,057 | Mason | Nov. 15, 1938 |
| 2,811,571 | Fritts et al. | Oct. 29, 1957 |
| 2,858,275 | Folberth | Oct. 28, 1958 |
| 2,874,453 | Losco et al. | Feb. 24, 1959 |